United States Patent
Scuderi

(10) Patent No.: US 9,160,376 B1
(45) Date of Patent: Oct. 13, 2015

(54) PROGRAMMABLE STABILIZATION NETWORK

(71) Applicant: QUALCOMM Incorporated, San Diego, CA (US)

(72) Inventor: Antonino Scuderi, San Diego, CA (US)

(73) Assignee: QUALCOMM, Inc., San Diego, CA (US)

( * ) Notice: Subject to any disclaimer, the term of this patent is extended or adjusted under 35 U.S.C. 154(b) by 0 days.

(21) Appl. No.: 14/487,000

(22) Filed: Sep. 15, 2014

(51) Int. Cl.
*H03C 1/00* (2006.01)
*H04B 1/04* (2006.01)

(52) U.S. Cl.
CPC .......... *H04B 1/04* (2013.01); *H04B 2001/0408* (2013.01)

(58) Field of Classification Search
CPC ................................ H03C 1/00; H03G 1/0017
USPC .......................................... 375/297, 296, 295
See application file for complete search history.

(56) References Cited

U.S. PATENT DOCUMENTS

| | | | |
|---|---|---|---|
| 2006/0197599 A1* | 9/2006 | Kim et al. | 330/278 |
| 2008/0169877 A1* | 7/2008 | Banba | 330/306 |
| 2010/0264990 A1* | 10/2010 | Hongo et al. | 330/278 |
| 2013/0154692 A1 | 6/2013 | Larsen et al. | |
| 2013/0307624 A1 | 11/2013 | Eplett | |
| 2013/0320946 A1 | 12/2013 | Luo et al. | |
| 2014/0002194 A1 | 1/2014 | Bult et al. | |
| 2014/0125299 A1 | 5/2014 | Barth et al. | |

* cited by examiner

*Primary Examiner* — Michael Neff
(74) *Attorney, Agent, or Firm* — Fountainhead Law Group P.C.

(57) ABSTRACT

The present disclosure includes programmable stabilization circuits and methods. In one embodiment, a power amplifier in a wireless transmitter includes a transistor comprising a gate, a source, and a drain. Feedback from the drain to the gate is modified dynamically to stabilize the amplifier under changing operating conditions. In one embodiment, a series RC circuit is configured between the drain the gate and the RC circuit value is adjusted based on different power supply voltage modes.

18 Claims, 6 Drawing Sheets

PROGRAMMABLE STABILIZATION NETWORK

BACKGROUND

The present disclosure relates to electronic circuits and methods, and in particular, to programmable stabilization circuits and methods.

The proliferation of wireless technologies and standards is placing ever increasing demands on electronic circuit technology. Circuits must be able to operate under drastically different operating conditions, and in some cases, must be able to perform well when a wireless system changes between various modes of operation. The complexities of this dynamic environment are particularly challenging for analog amplifiers, such as a power amplifier, in a wireless transmitter. A power amplifier, for example, may drive an antenna with enough output power to broadcast signals to a receiving system. Accordingly, the power amplifier must maintain stability when the wireless transmitter changes operating conditions during transmission, for example.

FIG. 1 illustrates a typical transistor device 110 used in a power amplifier circuit 100. One challenge with robust amplifier design pertains to the structure and parasitic effects of the transistors used to amplify signals in the transmission path. For example, some MOS transistor devices may have a very short gate length to compensate for high gate to drain capacitance (Cgd) 120 associated with some device structures. However, reducing the gate length can also cause the amplifier to become unstable under certain conditions. As illustrated by this example, some transistor devices and circuits designed to be stable for some operating conditions may be unstable for other operating conditions. However, conservative designs that are stable under all operation conditions may be highly inefficient in some situations, resulting in wasted power, for example.

SUMMARY

The present disclosure includes programmable stabilization circuits and methods. In one embodiment, a power amplifier in a wireless transmitter includes a transistor comprising a gate, a source, and a drain. Feedback from the drain to the gate is modified dynamically to stabilize the amplifier under changing operating conditions. In one embodiment, a series RC circuit is configured between the drain the gate and the RC circuit value is adjusted based on different power supply voltage modes.

The following detailed description and accompanying drawings provide a better understanding of the nature and advantages of the present disclosure.

DETAILED DESCRIPTION

The present disclosure pertains to programmable stabilization circuits and methods. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
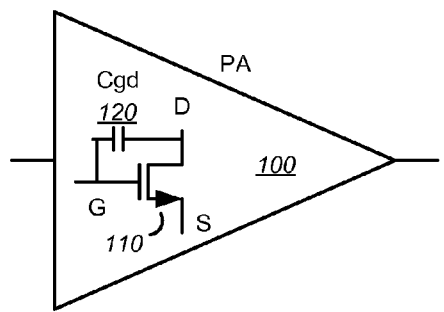
FIG. 1 illustrates a typical transistor device used in a power amplifier circuit.
Figure 2:
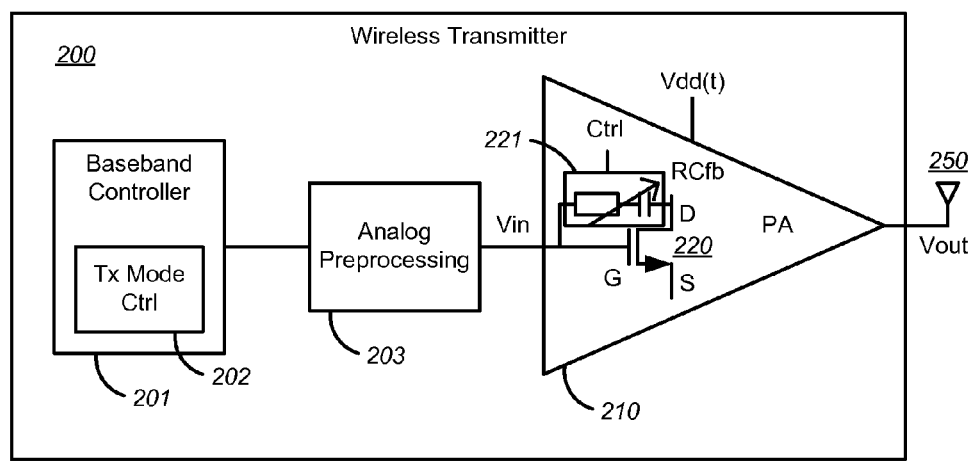
FIG. 2 illustrates a wireless transmitter including power amplifier according to one embodiment.

FIG. 2 illustrates a wireless transmitter 200 including a power amplifier (PA) 210 according to one embodiment. Wireless transmitter 200 may be part of a wireless communication system that can send and receive information using RF signals (receiver not shown). Wireless transmitter 200 may include a baseband controller 201 for receiving digital information to be transmitted as well as control information for controlling the operation of the transmitter. For example, transmitter 200 may operate in a variety of modes and may include transmit (Tx) mode control circuits 202 to configure the transmitter circuits to operating in different modes. Various modes may have different gain settings, power settings, or may pertain to different frequency bands and protocols, for example.

An output of baseband controller 201 is coupled to an input of an analog preprocessing block 203. Various embodiments of analog preprocessing may include digital-to-analog conversion of data to be transmitted, filtering, gain control, and/or modulation (up-conversion), for example. An output of analog preprocessing 203 is coupled to an input of power amplifier 210 for amplifying an input signal, Vin, and producing an output signal, Vout, to drive antenna 250.

Power amplifier 210 may include one or more gain stages comprising transistors. In this example, one gain stage is shown for illustrative purposes. In some embodiments, the gain stage may be at the output of a power amplifier where a drain of a gain stage transistor 220 is coupled to an antenna 250. In other embodiments, the gain stage may be an intermediate stage, where the drain is coupled to the antenna through one or more additional gain stages. In some embodiments, multiple gain stages inside a power amplifier may include programmable feedback as described herein, for example. The transistors in each gain stage are typically powered by a power supply voltage, Vdd. In certain applications, different operational modes may change the power supply voltage, Vdd, received by power amplifier 210. Since Vdd may change over time, it is sometimes denoted herein as Vdd(t). Example modes that effect the power supply voltage, Vdd, include an Average Power Tracking Mode ("APT mode"), an envelope tracking (ET) mode (e.g., where the power supply voltage corresponds to an envelope of a signal to be transmitted), or a low power mode (e.g., where a constant Vdd is reduced for lower power transmissions). The power supply voltage may also be impacted by the transmit power required when using different wireless transmission protocols, such as GSM, WCDMA, CDMA2000, or various LTE technologies including LTE5, LTE10, and LTE20, for example.

Changes in output power and/or power supply voltage can produce drastically different stability constraints on a power amplifier. Accordingly, features and advantages of the present disclosure include a transistor device 220 in a gain stage having a programmable feedback circuit 221 configured between a drain and a gate of the transistor device 220. Programmable feedback circuit 221 has an input terminal coupled to the drain of transistor 220, an output terminal coupled to the gate of transistor 220, and a control input to receive a control signal, Ctrl. Programmable feedback circuit 221 adjusts a series RC circuit between the gate and the drain of transistor 220 based on the control signal received on the control input. For instance, in particular embodiments, programmable feedback circuit 221 is configured to produce a first RC circuit value when the wireless transmitter 200 is configured to produce a first power supply voltage to the drain of transistor 220, and programmable feedback circuit 221 is configured to produce another RC circuit value to change a negative feedback from the drain to the gate of transistor 220 when wireless transmitter 200 is configured to produce a different power supply voltage to the drain of transistor 220. The control signal may be based on the mode of operation of transmitter 200, for example, so that as different modes change the power supply voltage provided to the drain of transistor 220, different feedback configurations from the drain to the gate may be programmed to maintain the stability and performance of the power amplifier. By way of example to illustrate advantages of the present disclosure, programmable feedback circuit 221 may be configured to produce a first RC circuit value between the drain and gate of transistor 220 when the wireless transmitter is configured to produce a variable power supply voltage corresponding to an envelope of the input signal (e.g., ET mode). However, programmable feedback circuit 220 may be configured to produce a second RC circuit value when the wireless transmitter is configured to produce a constant power supply voltage to the drain of the transistor (e.g., APT mode), where the second RC circuit value (e.g., in APT mode) is less than the first RC circuit value (e.g., in ET mode) to increase negative feedback from the drain to the gate to improve stability during APT mode, for example.

Figure 3:
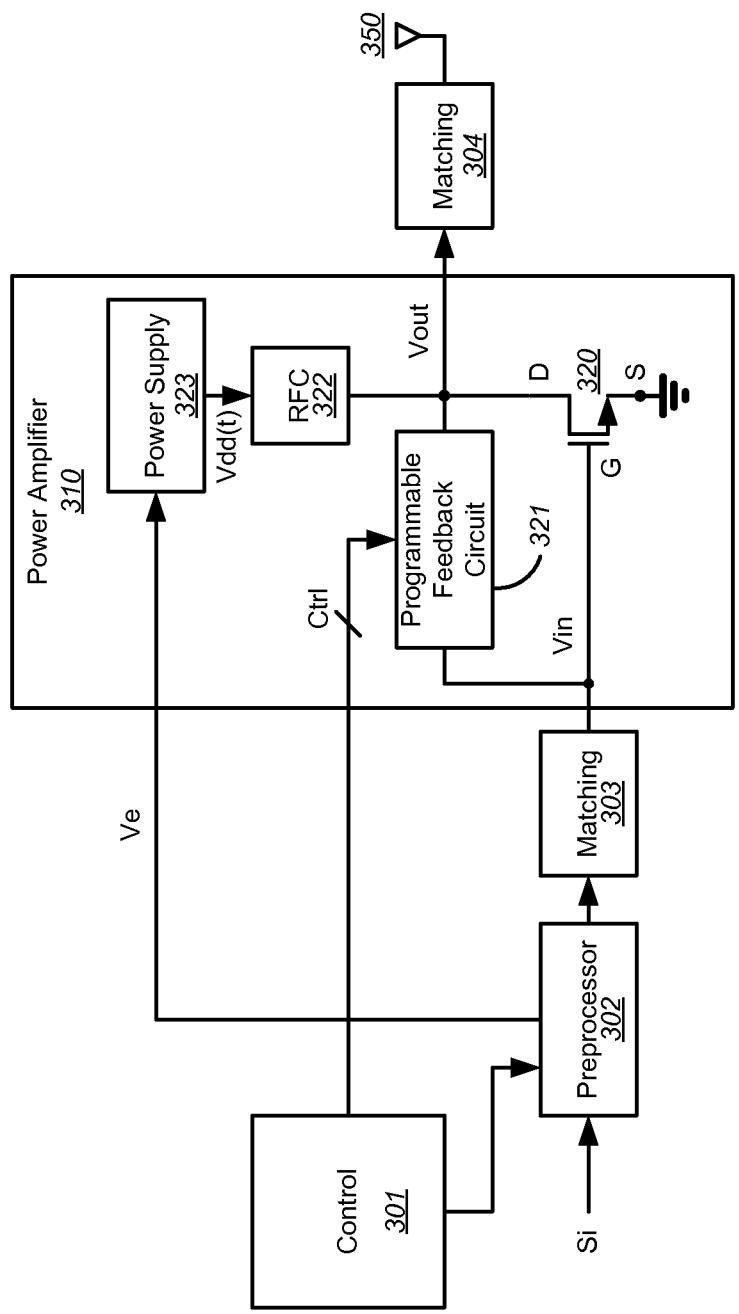
FIG. 3 illustrates a wireless transmitter including a power amplifier according to another embodiment.

FIG. 3 illustrates a wireless transmitter including a power amplifier according to one embodiment. In this example, a signal to be transmitted, Si, is provided to preprocessor 302. A control circuit 301 (e.g., a baseband or other processor) may determine a mode of operation for the transmitter and may configure preprocessor 302. For example, in some operating conditions the system may be configured to operate in a mode with a constant power supply voltage (e.g., APT mode or a low power mode). In this case, a power supply 323 may be configured to produce a constant Vdd. As another example, under other operating conditions the system may be configured to operate in a mode with a variable power supply voltage, such as an envelope tracking (ET) mode where the variable power supply voltage corresponds to an envelope of the input signal, Vin, of power amplifier 310, for example. In this case, control circuit 301 may configure preprocessor 302 to produce an envelope signal, Ve, to power supply 323 and a corresponding input voltage, Vin, which in this example is coupled to the input of power amplifier 310 through a matching network 303.

In this illustrative example, power amplifier 310 includes a transistor 320 having a gate configured to receive input voltage, Vin, a source coupled to ground, and a drain coupled to receive power supply voltage Vdd(t) through an RF choke (RFC) 322. An output of the amplifier (e.g., in this example, at the drain) produces an output voltage, Vout, which is coupled through a matching network 304 to an antenna 350. The power amplifier 310 is shown as having only a single MOS transistor stage for illustrative purposes only. It is to be understood that embodiments of the present disclosure may include multiple transistor stages, and in some embodiments the stages may include outputs arranged in cascade (e.g., stacked) or other typical power amplifier configurations. The features and techniques of the present disclosure are applicable to a wide range of amplifier topologies.

In this example, a programmable feedback circuit 321 has an input coupled directly to the drain of transistor 320 and an output coupled directly to the gate of transistor 320. In this case, programmable feedback circuit 321 receives control signal, Ctrl, which is a logic signal. In other embodiments Ctrl may be a continuous signal, for example. Here, programmable feedback circuit 321 may be configured by control circuit 301, which may be a baseband circuit, processor, or other logic circuit, for example, that may determine a mode of operation of the wireless transmitter and produce logic signal, Ctrl, for configuring the programmable feedback circuit 321. As one example, when the wireless transmitter is in ET mode, stability may not be as critical because the gain may be reduced as the power supply voltage is reduced for small signals. Accordingly, control circuit 301 may configure the programmable feedback circuit 321 to produce lower negative feedback by increasing a feedback resistance between the drain and the gate of transistor 320, for example. However, when the wireless transmitter is in APT mode, small signals processed by the amplifier may require additional feedback to maintain stability. Accordingly, control circuit 301 may configure the programmable feedback circuit 321 to produce higher negative feedback by decreasing a feedback resistance between the drain and the gate of transistor 320, for example. Accordingly, as mentioned above, an RC circuit value in APT mode may be less than an RC circuit value in ET mode to increase negative feedback from the drain to the gate. In one example implementation described below, a corner frequency of a high pass filter from the drain to the gate is decreased in APT mode to increase negative feedback and stabilize the device. Control circuit 301 may send control signals to programmable feedback circuit 321 to change the feedback between the drain and the gate to produce optimized stability of transistor 320 for a wide range of other operating modes, for example. Accordingly, APT and ET modes described above are merely illustrative.

Figure 4:
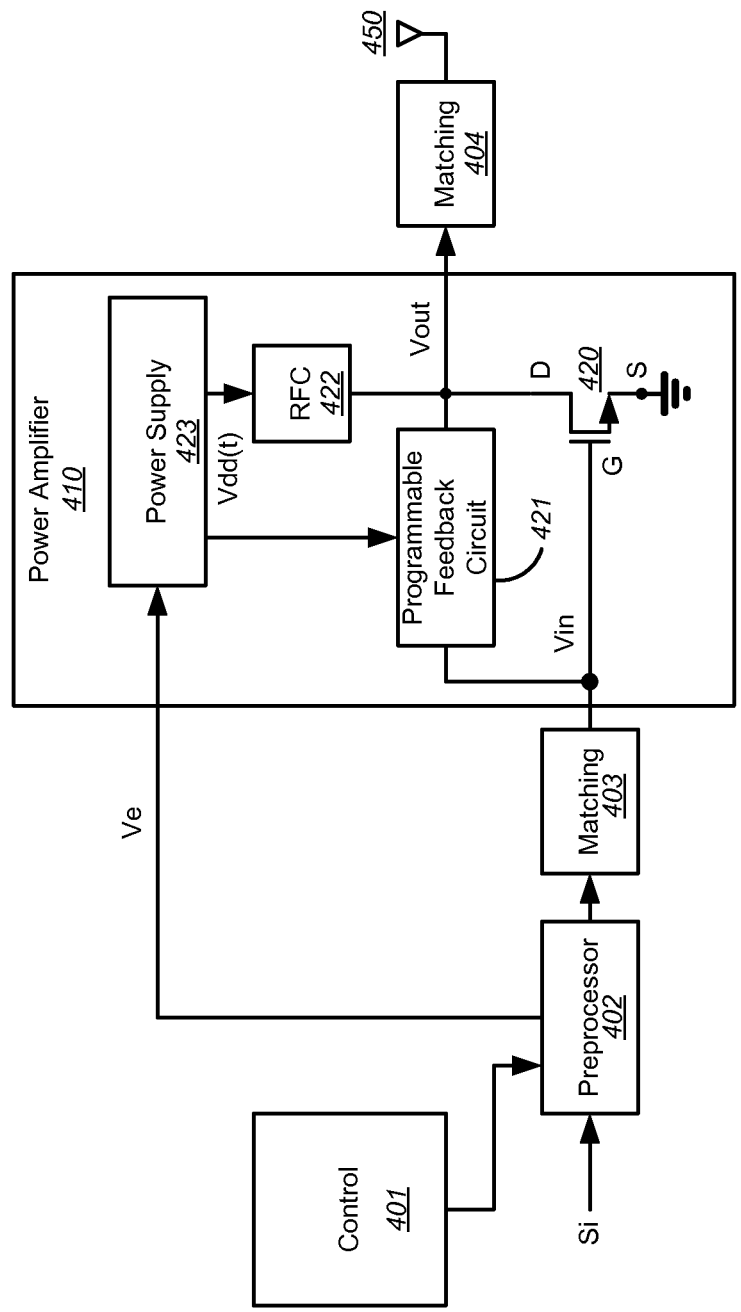
FIG. 4 illustrates a wireless transmitter including a power amplifier according to yet another embodiment.

FIG. 4 illustrates a wireless transmitter including a power amplifier according to yet another embodiment. Similar to the example in FIG. 3, a control circuit 401 may configure a preprocessor 402 for ET mode to produce an envelope signal, Ve, and input voltage Vin through matching circuit 403 (and possibly additional stages and circuitry in a signal path) to a gate of transistor 420. In this example, power supply 423 produces a power supply voltage, Vdd(t), which is coupled to both the drain of transistor 420 (through RFC 422) and to the control input of programmable feedback circuit 421. Accordingly, in some embodiments, feedback from the drain to the gate of transistor 420 may be adjusted based on the power supply voltage, Vdd(t), for example. As illustrated in more detailed examples below, changes in the power supply voltage may produce changes in the feedback from the drain to the gate of transistor 420 to improve stability of the power amplifier over changing operating conditions that have correspondingly different power supply voltage requirements.

Figure 5A:
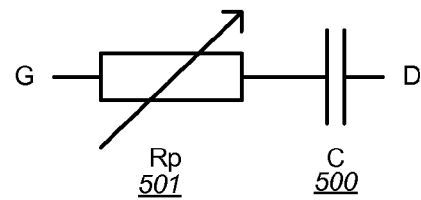
FIG. 5A illustrates an example programmable feedback circuit according to one embodiment.

FIG. 5A illustrates an example programmable feedback circuit according to one embodiment. In this example, a programmable feedback circuit includes a capacitor C 500 and a variable (or programmable) resistance Rp 501, which are configured in series. A first terminal of capacitor 500 is coupled to the drain (D) of a transistor and the second terminal of capacitor 500 is coupled to a terminal of Rp 501. A second terminal of Rp 501 is coupled to a gate (G) of the transistor. The programmable feedback in this example forms a series RC circuit having a value set by the product of resistance and capacitance (Rp*C). A signal passing from a gate to a drain of a transistor will produce an inversion, so the feedback is negative to improve stability. Capacitor C removes DC from the feedback path. Feedback is controlled by the resistance. As the resistance is increased, a feedback current is reduced, thereby reducing negative feedback. As the resistance is decreased, the feedback current is increased, thereby increasing negative feedback, lowering the gain, and stabilizing the circuit.

Figure 5B:
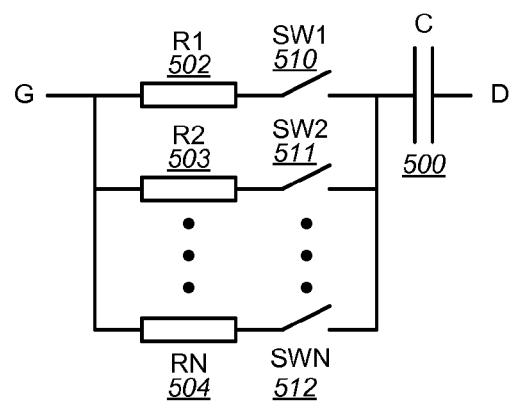
FIG. 5B illustrates an example programmable feedback circuit according to another embodiment.

FIG. 5B illustrates an example programmable feedback circuit according to another embodiment. Embodiments of a programmable feedback circuit may include a plurality of resistors, a plurality of switches (e.g., MOS transistors configured as switches), and a capacitor configured between a drain and a gate of a transistor. Similar to FIG. 5A, a first terminal of capacitor 500 is coupled to the drain of a transistor and the second terminal is coupled to a parallel configuration of resistors and switches. For example, a second terminal of capacitor 500 is coupled to terminals of N switches SW1-SWN denoted 510-512. The other terminal of each switch 510-512 is coupled to a terminal of a particular resistor R1-RN 502-504. A second terminal of each resistor 502-504 is coupled to the gate of the transistor. Accordingly, the parallel configuration of series resistors and switches may be programmed to change the resistance in series with capacitor 500. For example, when all switches SW1-SWN are open, there is no feedback from the drain to the gate. When SW1 is closed and the other switches are open, R1 502 is in series with capacitor 500 to produce a first RC circuit value. As additional switches are closed, the parallel configuration of resistors acts to reduce the total resistance in series with capacitor 500, thereby decreasing the RC circuit value. Switches may be opened and closed by a logic signal from a control circuit as mentioned above, for example. Embodiments of this particular example programmable feedback circuit may comprise resistors R1-RN having the same values or different values, for example, to tune the feedback according to the needs of a particular design.

Figure 5C:
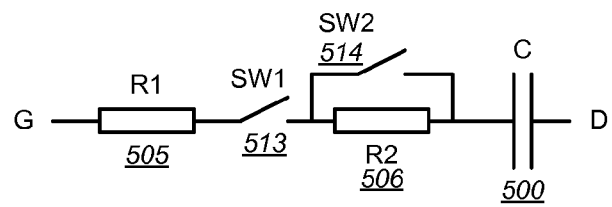
FIG. 5C illustrates an example programmable feedback circuit according to yet another embodiment.

FIG. 5C illustrates an example programmable feedback circuit according to yet another embodiment. In this example, a terminal of capacitor 500 is coupled to the drain of a transistor and another terminal of capacitor 500 is coupled to a first terminal of a resistor R2 506 and a first terminal of a switch SW2 514. A second terminal of resistor R2 506 is coupled to a second terminal of switch SW2 514 so that SW2 is configured in parallel with R2 to create a short circuit around R2 when SW2 is closed, and thereby remove R2 from the feedback circuit. The second terminal of R2 and the second terminal of SW2 are coupled to a first terminal of switch SW1 513. A second terminal of SW1 513 is coupled to a first terminal of resistor R1 505. A second terminal of resistor 505 is coupled to a gate of the transistor. Accordingly, when SW1 is open, there is no feedback from the drain to the gate. When SW1 is closed and SW2 is open, a series RC circuit is formed having an RC circuit value set by the sum of R1 and R2 multiplied by C (i.e., (R1+R2)*C). This configuration sets the highest RC circuit value with the highest feedback resistance and the lowest amount of negative feedback from the drain to the gate. Negative feedback may be increased by closing SW2 and shorting R2, thereby reducing the resistance in the feedback path from the drain to the gate of the transistor. The resulting RC circuit value is less than the RC circuit value when SW2 is open, and the negative feedback is increased to increase the stability of the circuit for this particular mode of operation. It is to be understood that various programmable feedback circuits according to other embodiments may have many numbers of discrete feedback resistances (or even a continuous range) available for programming corresponding to a wide variety of different modes of operation or transmission conditions, for example.

Figure 6A:
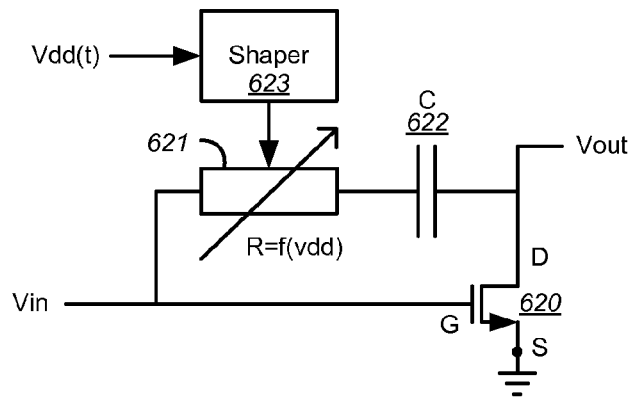
FIG. 6A illustrates an example programmable feedback circuit according to another embodiment.

FIG. 6A illustrates an example programmable feedback circuit according to another embodiment. In this example, the power supply voltage is used as the control input signal to vary the resistance in the feedback path between the drain and gate of a transistor in a power amplifier circuit and thereby dynamically adjust the stability of the circuit. In this example, a shaper circuit 623 receives a power supply voltage Vdd(t) to control a value of variable resistance 621. Variable resistance 621 is configured in series with capacitor 622 between a drain of transistor 620 and a gate of transistor 620. Shaper circuit 623 may produce a variety of functional relations between Vdd(t) and resistance, for example, by receiving Vdd(t) and producing a control input signal that is a function of Vdd(t). For example, in some embodiments, the output of shaper circuit may be related to an nth power of Vdd (e.g., Vdd$^n$(t), such as 1<n<2) so that resistance is a function of Vdd$^n$(t). It is to be understood that a shaper circuit may use any other suitable function of Vdd (e.g., an exponential).

Figure 6B:
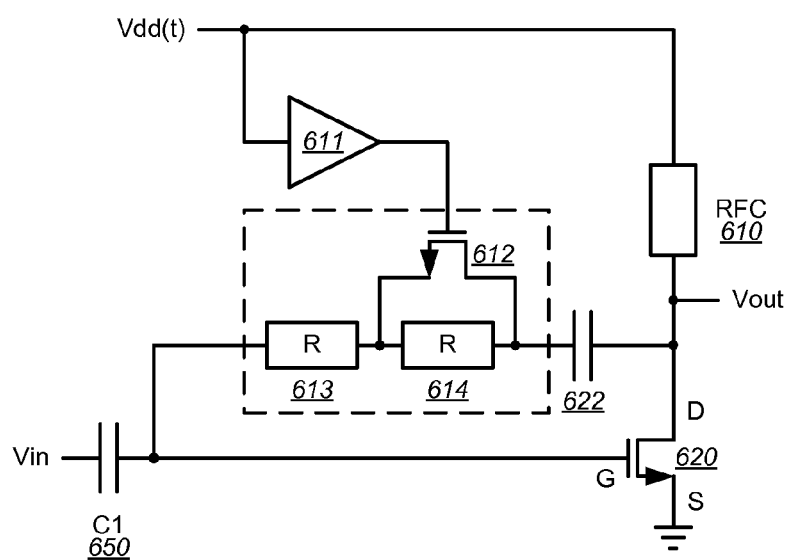
FIG. 6B illustrates an example programmable feedback circuit according to yet another embodiment.

FIG. 6B illustrates an example programmable feedback circuit according to yet another embodiment. This example illustrates one particular implementation example of using the power supply voltage as the control input signal to vary the resistance in the feedback path between the drain and gate of a transistor in a power amplifier circuit. For instance, transistor 620 may receive an input signal Vin through a DC coupling capacitor C1 650 on a gate and produce an output signal Vout through a drain, for example. A power supply voltage is coupled to the drain of transistor 620 through an RF choke (RFC) 610. A programmable feedback circuit in this example includes a capacitor 622 having a first terminal coupled to the drain of transistor 620. A second terminal of capacitor 622 is coupled to a first terminal of resistor 614. A second terminal of resistor 614 is coupled to a first terminal of resistor 613, and a second terminal of resistor 613 is coupled to the gate of transistor 620. Feedback resistance is varied in this example using a transistor 612 configured in parallel with resistor 614. A first terminal of transistor 612 is coupled to the first terminal of resistor 614 and a second terminal of transistor 612 is coupled to the second terminal of resistor 614. Power supply voltage Vdd is coupled to a control terminal of transistor 612 through gain stage 611, which may translate a range of Vdd values into a corresponding range of values for controlling transistor 612. For example, when Vdd is high, a voltage at the control terminal of transistor 612 may turn transistor 612 all the way on, thereby shorting out resistor 614. Accordingly, when Vdd is high, the resistance in series with the capacitor 622 is low, and the RC circuit value is low, increasing negative feedback from the drain to the gate to improve stability. However, as Vdd decreases, transistor 612 forms an increasingly resistive path in parallel with resistor 614. As the resistance in parallel with resistor 614 increases, the series resistance of the RC circuit increases, and the negative feedback decreases. When Vdd reaches some low threshold value, transistor 612 turns off, and a maximum feedback resistance is obtained with an RC circuit value equal to the sum of resistor 613 and resistor 614 multiplied by the capacitance 622, thereby setting a minimum negative feedback from the drain to the gate for the power amplifier gain stage.

Figure 7:
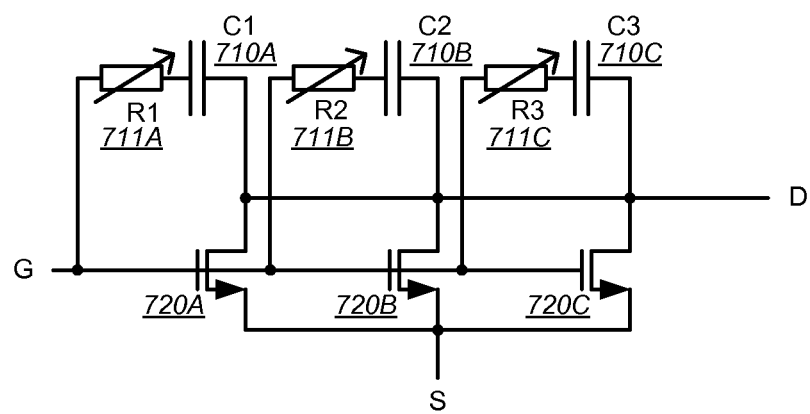
FIG. 7 illustrates an example transistor feedback circuit configuration according to another embodiment.

FIG. 7 illustrates an example transistor feedback circuit configuration according to another embodiment. Embodiments of the present disclosure may segment a transistor in a gain stage and provide separate RC feedback circuits around different segments as shown. For example, a particular transistor may be segmented into transistor segments 720A, 720B, and 720C ("segments"). Each segment may have a programmable RC feedback circuit coupled between a drain of the segment and the gate of the segment. For instance, segment 720A includes a resistor R1 711A and capacitor C1 710A configured in series between the drain of segment 720A and gate of segment 720A, for example. Similarly, segment 720B includes a resistor R2 711B and capacitor C2 710B configured in series between the drain of segment 720B and gate of segment 720B. Likewise, segment 720C includes a resistor R3 711C and capacitor C3 710C configured in series between the drain of segment 720C and gate of segment 720C. Segments 720A-C have gates, drains, and sources coupled together to form a single transistor device. Individual programmable feedback circuits for particular segments may improve uniformity over the transistor in the power amplifier stage, for example.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A wireless transmitter comprising:
a transistor comprising a source, a gate, and a drain, wherein the gate is coupled to an input signal to be transmitted, and wherein the drain is coupled to a power supply voltage and to an antenna, wherein the transistor is configured to amplify the input signal and produce an output signal;
a programmable feedback circuit having an input terminal coupled to the drain, an output terminal coupled to the gate, and a control input, wherein the programmable feedback circuit adjusts a series resistor and capacitor (RC) circuit between the gate and the drain of the transistor based on a control signal received on the control input,
wherein the programmable feedback circuit is configured to produce a first RC circuit value when the wireless transmitter is configured to produce a first power supply voltage to the drain of the transistor, and wherein the programmable feedback circuit is configured to produce a second RC circuit value to change a negative feedback from the drain to the gate when the wireless transmitter is configured to produce a second power supply voltage to the drain of the transistor.

2. The wireless transmitter of claim 1 wherein the first RC circuit value is produced when the wireless transmitter is configured to produce a variable power supply voltage corresponding to an envelope of the input signal, and wherein the second RC circuit value is produced when the wireless transmitter is configured to produce a constant power supply voltage to the drain of the transistor, and wherein the second RC circuit value is less than the first RC circuit value to increase negative feedback from the drain to the gate.

3. The wireless transmitter of claim 1 wherein the control signal is a logic signal.

4. The wireless transmitter of claim 1 wherein the control signal is a continuous signal.

5. The wireless transmitter of claim 1 wherein the control signal is the power supply voltage.

6. The wireless transmitter of claim 5 wherein the programmable feedback circuit comprises a voltage shaping circuit having an input coupled to receive the power supply voltage and an output producing a feedback resistance having a functional relation to the power supply voltage.

7. The wireless transmitter of claim 5 wherein the transistor is a first transistor, and wherein programmable feedback circuit comprises:
a capacitor having a first terminal coupled to the drain of the first transistor and a second terminal;
a first resistor having a first terminal coupled to the second terminal of the capacitor and a second terminal;
a second resistor having a first terminal coupled to the second terminal of the first resistor and a second terminal coupled to the gate of the first transistor; and
a second transistor having a first terminal coupled to the first terminal of the first resistor, a second terminal coupled to the second terminal of the first resistor, and a control terminal coupled to a control voltage based on the power supply voltage, wherein the control voltage turns on the second transistor as the power supply voltage increases to reduce a series resistance between the drain and the gate of the second transistor, and in accordance therewith, increase the negative feedback from the drain to the gate of the first transistor.

8. The wireless transmitter of claim 1 wherein the programmable feedback circuit comprises a plurality of resistors, a plurality of switches, and a capacitor.

9. The wireless transmitter of claim 8 wherein each one of the plurality of resistors is in series with one of the plurality of switches, and wherein the plurality of resistors are configured in parallel with each other and in series with the capacitor.

10. The wireless transmitter of claim 8, the plurality of resistors and the plurality of switches comprising:
a first resistor having a first terminal coupled to a first terminal of the capacitor and a second terminal;
a first switch having a first terminal coupled to the second terminal of the first resistor and a second terminal coupled to the first terminal of the first resistor;
a second switch having a first terminal coupled to the second terminal of the first resistor and a second terminal;
a second resistor having a first terminal coupled to the second terminal of the second switch and a second terminal coupled to the gate of the transistor,
wherein a second terminal of the capacitor is coupled to the drain of the transistor.

11. The wireless transmitter of claim 1 wherein the transistor comprises a plurality of segments each comprising a source, a gate, and a drain, wherein each segment comprises a resistor and capacitor configured in series between the drain and the gate of the segment.

12. The wireless transmitter of claim 1 wherein the drain is coupled to the antenna through one or more additional gain stages.

13. A method comprising:
receiving an input signal on a gate of a transistor, the transistor comprising a source, a gate, and a drain, wherein the drain is coupled to a power supply voltage and to an antenna, wherein the transistor is configured to amplify the input signal and produce an output signal;

dynamically coupling a portion of the output signal from the drain of the transistor to the gate of the transistor through a programmable feedback circuit having an input terminal coupled to the drain, an output terminal coupled to the gate, and a control input, wherein the programmable feedback circuit adjusts a series resistor and capacitor (RC) circuit between the gate and the drain of the transistor based on a control signal received on the control input, wherein the programmable feedback circuit is configured to produce a first RC circuit value when the wireless transmitter is configured to produce a first power supply voltage to the drain of the transistor, and wherein the programmable feedback circuit is configured to produce a second RC circuit value to change a negative feedback from the drain to the gate when the wireless transmitter is configured to produce a second power supply voltage to the drain of the transistor.

14. The method of claim 13 wherein the first RC circuit value is produced when the wireless transmitter is configured to produce a variable power supply voltage corresponding to an envelope of the input signal, and wherein the second RC circuit value is produced when the wireless transmitter is configured to produce a constant power supply voltage to the drain of the transistor, and wherein the second RC circuit value is less than the first RC circuit value to increase negative feedback from the drain to the gate.

15. The method of claim 13 wherein the control signal is a logic signal.

16. The method of claim 13 wherein the control signal is a continuous signal.

17. The method of claim 13 wherein the control signal is the power supply voltage.

18. A wireless transmitter comprising:

a transistor comprising a source, a gate, and a drain, wherein the gate is coupled to an input signal to be transmitted, and wherein the drain is coupled to a power supply voltage and to an antenna, wherein the transistor is configured to amplify the input signal and produce an output signal on the drain;

means for adjusting negative feedback from the drain to the gate of the transistor based on a control signal, wherein said means for adjusting negative feedback comprises a resistor and capacitor (RC) circuit and is configured to produce a first RC circuit value when the wireless transmitter is configured to produce a variable power supply voltage corresponding to an envelope of the input signal to the drain of the transistor, and wherein said means for adjusting negative feedback is configured to produce a second RC circuit value less than the first RC circuit value to increase negative feedback from the drain to the gate when the wireless transmitter is configured to produce a constant power supply voltage to the drain of the transistor.

* * * * *